United States Patent
Liu et al.

(10) Patent No.: US 7,106,598 B2
(45) Date of Patent: Sep. 12, 2006

(54) PASSIVE COMPONENT ASSEMBLY FOR MULTI-LAYER MODULAR ELECTRICAL CIRCUIT

(75) Inventors: David Liu, Gaithersburg, MD (US); Chengping Zhang, Rockville, MD (US); Michael T Duignan, Washington, DC (US)

(73) Assignee: Potomac Photonics, Inc., Lanham, MD (US)

( * ) Notice: Subject to any disclaimer, the term of this patent is extended or adjusted under 35 U.S.C. 154(b) by 127 days.

(21) Appl. No.: 10/865,807

(22) Filed: Jun. 14, 2004

(65) Prior Publication Data

US 2004/0233651 A1    Nov. 25, 2004

Related U.S. Application Data

(62) Division of application No. 10/224,639, filed on Aug. 21, 2002, now Pat. No. 6,898,846.

(51) Int. Cl.
H05K 1/00 (2006.01)
H05K 1/11 (2006.01)
H05K 7/02 (2006.01)

(52) U.S. Cl. ............ 361/766; 361/811; 361/761; 361/793; 174/262

(58) Field of Classification Search ........ 361/760, 361/763, 766, 767; 333/193, 174, 133, 175, 333/185, 204; 257/774, 758
See application file for complete search history.

(56) References Cited

U.S. PATENT DOCUMENTS

| | | | |
|---|---|---|---|
| 4,758,922 A | | 7/1988 | Ishigaki et al. |
| 5,708,569 A | * | 1/1998 | Howard et al. ............ 361/760 |
| 5,834,994 A | | 11/1998 | Shapiro |
| 6,021,050 A | * | 2/2000 | Ehman et al. ............ 361/793 |
| 6,218,729 B1 | | 4/2001 | Zavrel et al. |
| 6,395,996 B1 | * | 5/2002 | Tsai et al. .................. 174/260 |
| 6,456,172 B1 | * | 9/2002 | Ishizaki et al. ............ 333/133 |
| 6,577,208 B1 | * | 6/2003 | Kushitani et al. .......... 333/174 |
| 6,653,574 B1 | * | 11/2003 | Tsai et al. .................. 174/260 |
| 6,683,781 B1 | * | 1/2004 | Ho et al. .................. 361/301.1 |
| 6,700,203 B1 | * | 3/2004 | Cabral et al. .............. 257/774 |
| 6,750,737 B1 | | 6/2004 | Uriu et al. |
| 6,809,268 B1 | * | 10/2004 | Hayashi et al. ............ 174/260 |

OTHER PUBLICATIONS

M.F. Davis, et al., "RF-Microwave Multi-Band Design Solutions for Multilayer Organic System on Package Integrated Passives", 2002 IEEE MTT-S Digest, pp. 2217-2220.

Sidharth Dalmia, et al., Design and Optimization of High-Q RF Passives on SOP-Based Oganic Substrates, 2002 Electronic Components and Technology Conference, pp. 295-503.

* cited by examiner

Primary Examiner—Randy W. Gibson
Assistant Examiner—Hoa C. Nguyen
(74) Attorney, Agent, or Firm—Rosenberg, Klein & Lee

(57) ABSTRACT

A method for manufacturing a modular electrical circuit includes the steps of pre-manufacturing a plurality of components having fine features such as resistors, capacitors, inductances, and conductors formed on a dielectric substrate. The pre-manufactured components are laminated each to the other in a predetermined order. Each pre-manufactured component includes one or more electrical elements of the same type coupled each to the other by conducting lines. Each dielectric substrate includes through vias filled with the conductive material which serve for cross-coupling of the elements of neighboring components. Position of the passive elements, as well as conductive lines and through vias, are pre-designed to allow precise coordination between the elements of different components in the multi-layered modular electrical circuit.

6 Claims, 8 Drawing Sheets

US 7,106,598 B2

PASSIVE COMPONENT ASSEMBLY FOR MULTI-LAYER MODULAR ELECTRICAL CIRCUIT

This application is a divisional of application Ser. No. 10/224,639 filed on 21 Aug. 2002, now U.S. Pat. No. 6,898,846.

FIELD OF THE INVENTION

The present invention relates to manufacturing of modular electrical circuits; and more particularly, to a manufacturing technique for producing multi-layered modules with electrical circuitry contained therein.

Additionally, in further overall concept, the present invention is directed to a technique for manufacturing multi-layered modules, each containing a plurality of dielectric layers with at least one electrical element pre-formed thereon prior to assembling and lamination of the plurality of layers into the multi-layered module, wherein the elements formed on each of the layers are electrically coupled each to the other through vias crossing each layer at predetermined locations and filled with a conductive material.

Even further, the present invention relates to components pre-formed for manufacturing of multi-layered modules containing electrical circuitry and more particularly to a pre-formed component which includes a dielectric layer with at least one however, preferably a plurality, of similar passive electrical elements disposed at predetermined locations of the dielectric layer. In this manner, a layer with resistors, or a layer with capacitors, or a layer with inductors are manufactured to be further laminated each to the other and electrically interconnected through vias formed in each layer and filled with a conductive material prior to the laminating process, in order to interconnect the electrical elements of each layer into a single electrical circuitry.

The present invention further relates to a multi-layer laminated module containing an electrical circuitry such as a filter. Such a module includes a plurality of layers having passive elements pre-formed thereon prior to the lamination of the layers into a single module wherein one or several passive elements of similar type are formed on each layer.

In this manner, one layer may include resistors, another layer may include capacitors, and a third layer may include inductors pre-formed on the respective layers in a quasi-parallel fashion prior to laminating the layers into a single multi-layered modular structure. The passive elements on each layer are additionally located at predetermined positions and are interconnected in a predetermined order by electrical conductors extending on the layer. The electrical elements on each layer are also connected with respective passive electrical elements on neighboring layers by means of through vias pre-formed in each layer and pre-filled by a conductive material prior to laminating the layer into a single multi-layer modular structure.

The present invention also relates to a method of manufacturing filter circuitry, either a bandpass filter, a high pass filter, or a low pass filter, by means of pre-forming passive electrical elements (resistors, conductive lines, inductors and capacitances) on respective dielectric layers and laminating such pre-manufactured layers into a single multi-layered modular structure.

BACKGROUND OF THE INVENTION

It is known in the art to manufacture electrical circuits in a modular implementation such that each modular electric circuit includes a plurality of electrical elements interconnected in a predetermined order to form the electrical circuit. Several approaches have been used to manufacture modular electrical circuits which include formation of the circuits in a planar configuration or as multi-layer modules.

In a planar configuration, best shown in FIG. 1, passive electrical elements are created on a single substrate 10 in a sequential manufacturing process. These electrical elements are then further connected each to the other by conductors 12. For example, in order to fabricate a filter (either a bandpass filter, low pass filter, or high pass filter) in a planar configuration, the resistors 14, inductors 16, and capacitor(s) 18 are formed at predetermined locations on the substrate 10 in sequential operational steps. Further, conductors 12 and contact pads 20 are deposited on the surface of the substrate 10 to couple the passive elements into a single circuit 22. To create the conductors 12, contact pads 20, resistors 14, inductors 16, and capacitor(s) 18, different manufacturing processes may be implemented which are known to those skilled in the art. Such processes may include thin film or thick film techniques, as well as hybrid or integration manufacturing techniques. The modular electrical circuits in planar configuration are relatively simple structures in which no via holes are needed to cross through the substrate 10 and which are easily repairable. However, this approach has several shortcomings. Initially, the circuit implemented as a planar formation uses a large area of the substrate 10. Further, during sequential operational processes, the components (electrical elements) created in the previous operational steps, are exposed to multiple "firing" cycles, that may decrease the yield or quality of electrical circuits.

Another approach to manufacturing modular electrical circuits, i.e., multi-layer modules, as shown in FIG. 2, employs depositing of a polyimide layer 24 (preferably by spin-coating of polyimide) on the surface of a supporting substrate 26 (made from silicon, GaAs, AlN, etc.), and building up basic components such as resistors, inductors, capacitors, and conductors by sequential layering. This technique may be accomplished by using thin film fabrication processes. Specifically, after spin-coating the polyimide layer 24 on the surface of the substrate 26, a first layer 28 is deposited through sputtering or by chemical vapor deposition on the surface of the polyimide layer 24. Subsequently sequential photolithography processes are performed in a predetermined order which include depositions of a photoresist on the surface of the layer 28 and exposure of the photoresist through a mask to create a desired pattern on the layer 28. This will be further followed by etching to create vias 30 extending through the layer 28; or followed by formation of passive elements of a predetermined type and topography at the areas of the layer 28 uncovered during photolithography. The conductors and contact pads may also be deposited onto the surface of the layer 28 to interconnect the elements 32 in predetermined fashion in layer 28 which allows coupling to the passive elements of another layer 34 through the vias 30.

When the pattern of passive elements and/or metal conductors is formed on the first layer 28, another thin film, i.e., the second layer 34, is deposited by sputtering or by chemical vapor deposition on the surface of the first layer 28. Subsequently sequential photolithography steps are performed to form desired passive elements and/or metal conductors on the second layer 34. The layer-by-layer sequential process is continued until all constituents needed for an electrical circuit are formed and interconnected in a predetermined order within each layer as well as between layers.

The manufacture of multi-layer modules shown in FIG. 2, allows the user to create detailed features in a very accurate process. However, disadvantaaeously, this process is a sequential process, in which lower layers are exposed to multiple "firing" cycles, and associated therewith are unwanted multiple heat stresses. Therefore, the overall performance of such a multi-layer module depends on the earlier formed layers, which sometimes are vulnerable to heat stress common to the sequential manufacturing processes. Additionally, this approach has the shortcoming of a slow turn-around which is time and labor consuming lending to a greater fabrication expense. In addition, multi-layer modules thus created are non-trimmable structures that prevents them from being tuned to achieve the target values.

It is therefore desirable in the field of the manufacture of modular electrical circuits to find a new approach which allows the user to avoid exposure of elements of the circuits to multiple "firing" cycles, while simultaneously providing for flexibility of the process, short turn-around time and high yield of production of quality devices.

SUMMARY OF THE INVENTION

It is therefore an object of the present invention to provide a method for manufacturing modular electrical circuits, in which exposure of elements of the electrical circuit to multiple "firing" cycles is avoided.

It is another object of the present invention to provide a method of manufacturing modular electric circuits by laminating into a multi-layer modular electrical circuit formed of a plurality of individual pre-manufactured layers, with each carrying a single or a plurality of a similar type passive electrical elements pre-formed thereon.

It is a further object of the present invention to provide constituents (or components) for manufacturing modular electrical circuits wherein each such constituent includes a layer of insulating material, vias formed through each layer at predetermined locations, and at least one, but preferably, a plurality of electrical elements of a similar type pre-formed on the layer of insulating material and coupled each to the other, if needed, through conductive lines extending between the electrical elements. Such a constituent is laminated to another constituent(s), in order to form, in combination, a multi-layer modular electrical circuit wherein the elements created on each layer of insulating material are coupled each to the other in a predetermined fashion in each layer and are further coupled to the element formed on neighboring layers of insulating materials through vias formed in each layer.

It is still a further object of the present invention to provide a modular electrical circuit manufactured by laminating each to the other, a plurality of pre-manufactured individual layers of insulating material, each carrying passive electrical elements formed thereon, wherein the passive electrical elements are interconnected in each layer by conductors and are further coupled to the passive electrical elements of the neighboring layers through vias pre-formed in each layer and pre-filled with a conducting material prior to the lamination of the layers into a single multi-layer modular structure.

It is still a further object of the present invention to provide a method for manufacturing a bandpass filter, low pass filter, or high pass filter, providing a laminate having a layer with resistors pre-formed thereon, a layer having inductor patterns pre-formed thereon, as well as a layer with capacitances pre-formed thereon are laminated each to the other.

According to the teachings of the present invention, a method for manufacturing a modular electrical circuit comprises the steps of:

forming on each of a plurality of dielectric layers a respective type of a passive electrical element (or a plurality of electrical elements, preferably, of the same type, coupled each to the other in a predetermined fashion by conductors extending on this layer), and laminating the plurality of the layers with the respective passive electrical elements on each of them into a single modular structure, thus forming the modular electrical circuit.

Prior to lamination of the plurality of the constituent layers into a modular structure through vias are formed at predetermined locations of each layer and pre-filled With a conductive material. In this manner, the passive electrical elements interconnected by conducting lines at the level of their layer may also be coupled to the passive electrical elements of the neighboring layers through the vias.

To secure the layers one to another, the multi-layered modular structure is exposed to heat and pressure for lamination.

In order to be properly assembled into the multi-layered modular structure, each layer is provided with alignment indicia for alignment of the layers each to the other. Additionally, the layers formed of dielectric material are preferably transparent to light, in order that an operator may optically align the layers one to another in the process of stacking them.

The method of the present invention also contemplates interposing the adjacent layers having the passive electrical elements thereon with an adhesive layer, also referred to herein as a contact pads layer. This is a dielectric layer having through vias formed at predetermined locations thereof and filled with a conducting material as well as contact pads formed on the surface of the adhesive or contact pads layer. In this manner, interconnection between the passive elements formed in each layer as well as connection to external devices is carried out through the contact pads layer.

Preferably each constituent layer with the pre-formed passive electrical elements thereon is manufactured by the steps of:

positioning a material covered element in proximity to a respective layer (also referred herein to as a substrate), and directing a controllable energetic beam (laser beam) towards the layer through the material covered element.

The material covered element includes a transparent carrier and a material layer. The material layer of predetermined thickness is sandwiched between the transparent carrier and the surface of the substrate on which passive electrical elements are to be formed. By controlling the relative disposition between the energetic beam and the substrate on which the passive electrical elements are to be formed, the material transfer from the material layer to the predetermined locations on the substrate is generated. The material is deposited on the substrate, which forms passive electrical elements at predetermined locations thereof.

Another aspect of the present invention is directed to a component specifically pre-manufactured for assembling therefrom a modular electrical circuit. Such a component includes a layer of insulating material, with at least one via formed through such a layer, and at least one, but preferably a plurality, of passive electrical elements, formed on the layer of insulating material in electrical contact with the through vias. A plurality of the components, each of which includes a passive electrical element (or elements) pre-formed and interconnected (if needed) by conducting lines are further laminated to each other to form in combination, a modular electric circuit.

A still further aspect of the present invention is directed to a modular electrical circuit having a multi-layered structure assembled from pre-manufactured components where each component has a specific passive electrical element, conducting lines, and through vias. Assembled into the modular electrical circuit, these pre-manufactured components, in combination, may constitute a filter circuit (either bandpass filter, low pass filter, or high pass filter). Specifically, in the manufacture of a filter circuit, one component may have resistors coupled each to the other in a predetermined order. Another component may contain an inductor (or inductances) pre-formed on the layer, and coupled to others in a predetermined manner. The third component may include one or more capacitors coupled each to the other in a predetermined fashion. The resistances, inductances, and capacitances interconnected each to the other within their respective layer, are further coupled to the elements of the neighboring components by means of the through vias filled with the conducting material.

Preferably, adjacent components are interposed with a contact pad layer, which is a dielectric layer with vias formed therethrough and filled with a conducting material with contact pads deposited on the surface of the dielectric layer.

These and other novel features and advantages of the subject invention will be more fully understood from the following detailed description of the accompanying Drawings.

DESCRIPTION OF THE PREFERRED EMBODIMENTS

Figure 1:
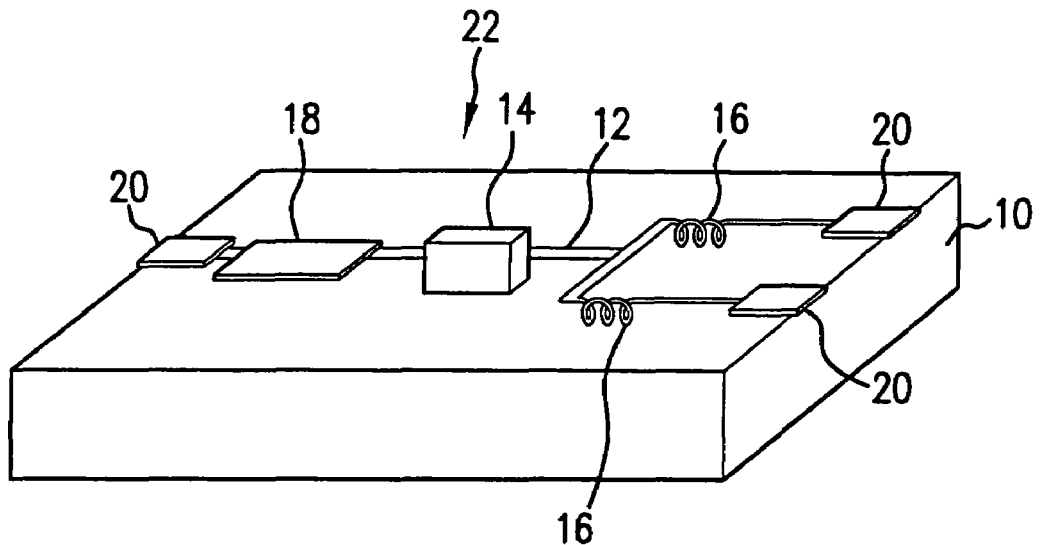
FIG. 1 illustrates schematically a planar configuration of the modular electrical circuit of the prior art.
Figure 2:
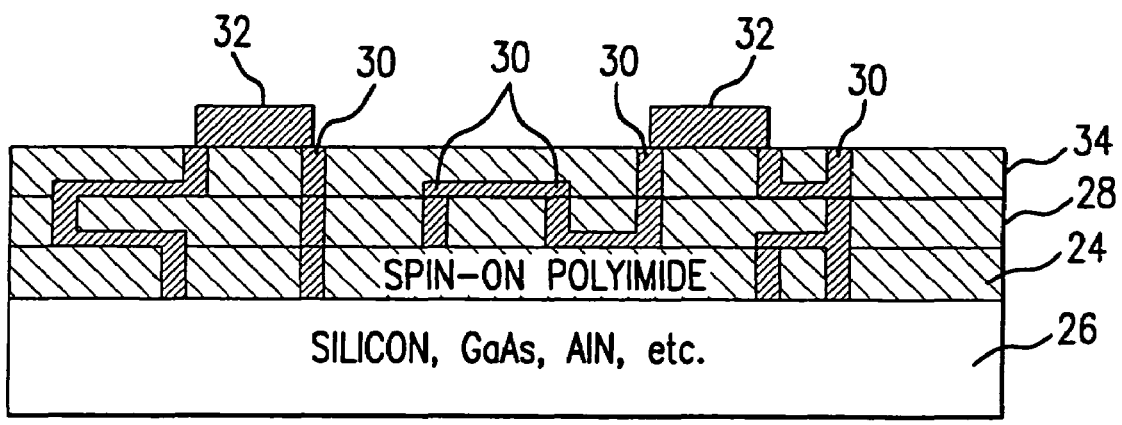
FIG. 2 illustrates schematically a multi-layer modular electrical circuit of the prior art.
Figure 3:
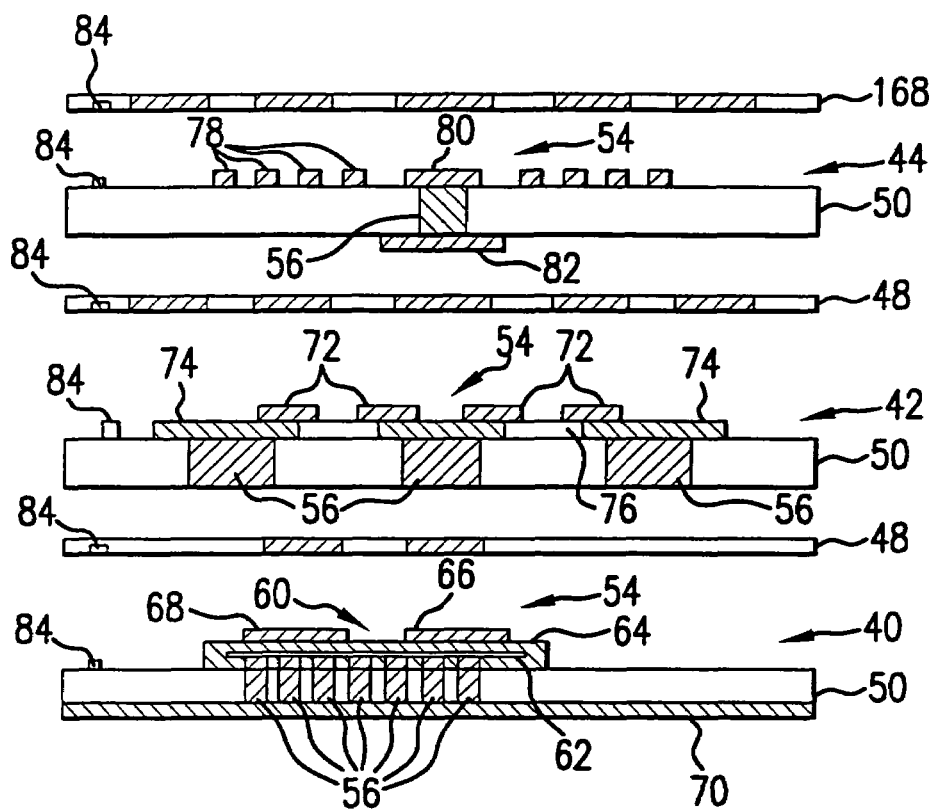
FIG. 3 illustrates schematically the sequence of operations of the method of the present invention, wherein a resulting modular structure is formed from a plurality of pre-manufactured individual components with passive electrical element formed thereon and contact pad layers.
Figure 3:
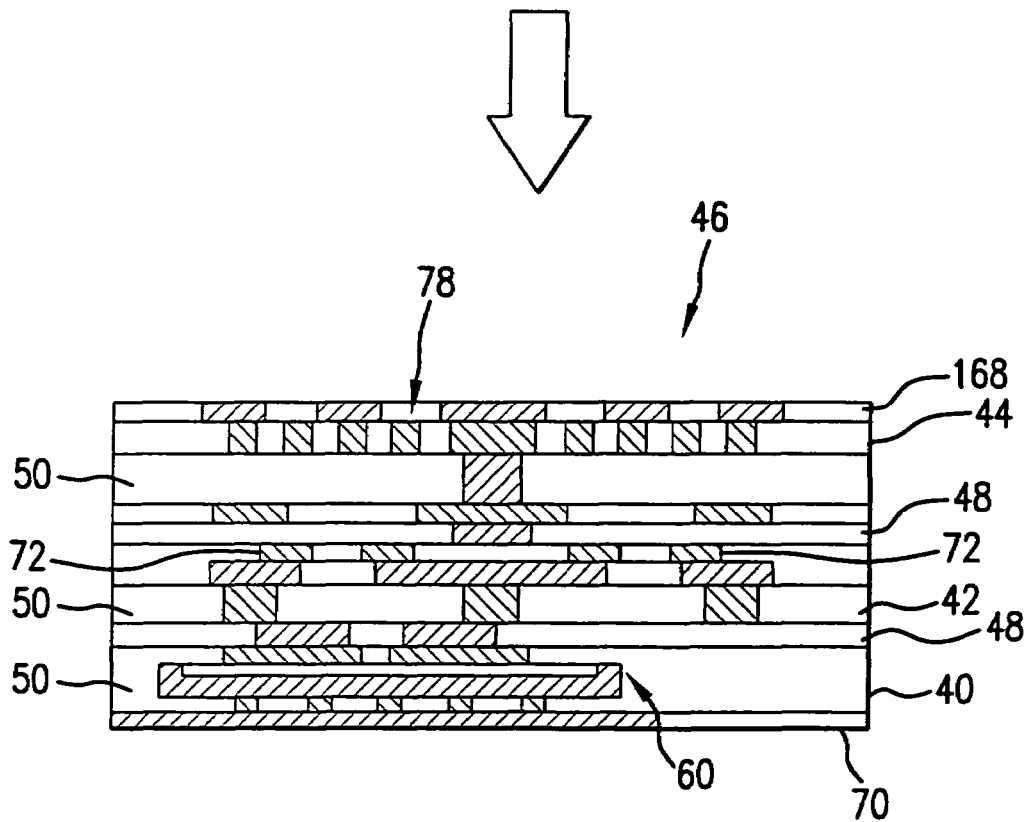

The method of the subject invention uses a technique for manufacturing modular electrical circuitry from pre-manufactured components, implemented as electrical elements of different varieties pre-formed on "backbone" layers prior to assembling them in a predetermined fashion into a resulting modular structure containing electrical circuits. As shown in FIG. 3, a "backbone" capacitor layer 40, a "backbone" resistor layer 42 and a "backbone" inductor layer 44 pre-formed in prior cycles, as will be described in more detail in following paragraphs are laminated each to the other to form a multi-layer modular structure 46 containing an electrical circuit.

It will be readily understood to those skilled in the art that the mutual disposition of the pre-manufactured components shown in FIG. 3, as well as their specific design, is chosen as an example from many possible arrangements. Many other alternative assembling orders as well as positioning of the electrical elements in each component are also contemplated in the scope of the invention and all are subject to design requirements of specific electrical circuits to be manufactured.

Thus, in the example of the modular structure, shown in FIG. 3, the adjacent of the layers 40, 42, and 44, are interposed with adhesive (or contact pad) layers 48 which are dielectric layers with through vias formed at predetermined locations. The through vias are filled with a conducting material, for instance, silver, and, being in contact with respective passive elements, serve to provide an electrical connection between the passive elements in different layers 40, 42, and 44. The adhesive layers 48 also have contact pads formed thereon for coupling the electrical circuit to external devices such as power source, or for hybridizing the modular electrical circuits into larger circuits or systems.

Each of the pre-manufactured components, also referred to herein as layers 40, 42, and 44, with the electrical elements formed thereon, serve as a "building block" for manufacturing of a modular electrical circuit 46. Each such layer includes a dielectric substrate 50 with at least one, but possibly a plurality of electrical elements (for example, inductors, or resistors, capacitors or conductor lines) on each of the layers. Conductor lines may be formed on either surface of the dielectric substrate 50 for interconnecting the electric elements 54 in the planar level of each substrate 50, as will be described in following paragraphs. The electric elements 54 in different levels (substrates) 50 may be also interconnected through vias 56 formed through the dielectric substrate 50 and pre-filled with conducting material. Either the electric elements 54 are positioned in direct contact with respective vias 56 or are connected to respective vias 56 through corresponding conductive lines extending therebetween on the substrate 50. The electrical connection between the elements may be accomplished through contact pads (formed either on the surface of the dielectric substrate 50 or on the adhesive pad layer 48) in accordance with a specific design of the electrical circuit to be created.

In this fashion, the layer 40 which, for example, may be a capacitive layer, will have a capacitor 60 (or several capacitors 60) formed on the dielectric substrate 50 by any known manufacturing process applicable to fabrication of miniature capacitance structures. Such a capacitor (or capacitors) 60 formed at predetermined locations on the surface of the dielectric substrate 50, may include a layer 62 of conducting material deposited on the surface of the dielectric substrate 50, dielectric layer 64, and a pair of electrodes 66 and 68 on the top of the dielectric layer 64. In addition, the capacitor layer 40 may have a plurality of through vias 56 filled with conductive material, for example, silver, to form an electrical coupling between the capacitor 60 and the ground layer 70 deposited on the lower surface of the substrate 50 of the capacitor layer 40.

In similar manner, the resistor layer 42 includes a dielectric substrate 50 with a plurality of through vias 56 filled with the conductive material, a plurality of resistors 72 deposited on the surface of the dielectric substrate 50 at predetermined locations to create a topology predefined for the electrical circuit, and a plurality of conductive lines 74 intermittent with regions of insulating material 76. The conductive lines 74 interconnect the resistors 72 in a predetermined order and also connect the resistors 72 to respective through vias 56 and possibly to contact pads which either may be deposited on the surface of the dielectric substrate 50 of the resistor layer 42 or formed on the adhesive (or contact pads) layers 48.

The inductor layer 44, in accordance with the overall principles of the present invention includes a single or several inductances 78 shown herein as spirally shaped inductances (however, any other inductance contour also can be used), a through via 56, as well as a contact pad 80 on the top surface of the dielectric substrate 50 and a contact pad 82 on the bottom surface of the dielectric substrate 50 of the inductor layer 44.

The materials used to create the passive components must be compatible with the maximum temperature limits of the substrate (e.g., polyimide 350–400° max). For one of the implementations, the materials used included low-temperature silver paste such as Parelec Parmod™ for conductors, commercial polymer thick film resistor pastes (MeTech) and barium titanate/glass laser-sintered dielectric. Polyimide thickness was ~3–5 mil per layer. After firing at ~300° C. minutes conductor resistivity was approximately 2–4 times that of bulk silver metal.

The capacitor layer 40, the resistor layer 42, and the inductor layer 44, as well as the adhesive layers 48, are the "building blocks" for the multi-layer modular electrical circuit 46. To build a modular structure 46, the layers 40, 42, and 44, as well as the contact pads layers 48, each having a predefined topology of the passive elements, through vias and/or contact pads, are assembled each to the other using an alignment indicia 84 formed on each of the layers 40, 42, 44, and 48. The alignment indicia could be tooling holes, fiduecials, etc.

Preferably, the dielectric substrate 50 is formed of a transparent dielectric material, such as, for example, polyimide, in order to facilitate positioning the layers while stacking them up in a predetermined fashion.

After attachment of the layers each to the other, thus forming a multi-layered structure, the layers are secured each to the other by means of lamination at a pressure of 300–500 psi at a temperature of 250–300° C.

The multi-layer modular structure 46, although shown in FIG. 3, as a three-layered structure, may include any number of layers. For example, the structure may be a one layer module which would include either a capacitor layer, or a resistor layer, or an inductor layer. Alternatively, the structure may be a two layer structure which would include either two of three layers 40, 42, and 44. It is to be understood that the multi-layered modular structure 46 may include more than three layers arranged in stacked fashion in a predetermined order. The number of layers and specific pattern of the passive electric elements created on each layer, as well as mutual disposition of the layers, is determined by the requirements of a specific design of a resulting modular electrical circuit to be created.

For formation of base elements such as capacitor layer 40, resistor layer 42, or inductor layer 44, as well as adhesive layer 48, known in prior techniques allowing a fabrication of miniature features on a dielectric substrate are applicable. This may include a thick film process approach or a thin film process approach including sputtering or chemical vapor deposition of a thin film on the surface of the dielectric substrate 50, with further deposition of a photoresist on the thin film layer and exposure of the photoresist through a mask having a pre-formed required pattern thereon. The process continues with the development of the photoresist, followed by the etching away of uncovered portions of a thin film to a certain depth. The etching may further be followed by filling the formed vias or channels with a conducting material for forming a system of conductor lines between the elements, as well as filling the through vias with the conductive material.

To create a pattern of passive electric elements, such as resistors or inductors, photolithography principles may be applied to form the "fundamental blocks", such as resistor layer 42, and inductor layer 44. Any known technique for forming a capacitor (or capacitors) on the surface of the dielectric substrate 50 is applicable to the manufacturing of the capacitor layer 40. Such approaches may include deposition of a metal layer 62, on uncovered region of the substrate 50, with further deposition of a dielectric layer 64 on the top of the layer of the conductive material 62, and further metallization of the dielectric layer 64 at the areas predefined by the photolithography process for forming electrodes 66 and 68 of the capacitor 60. It will be readily understood by those skilled in the art, that several sequential photolithographic cycles may be performed to form capacitor elements 60 on the substrate 50.

Although the through vias 56 and any channels in the substrate 50 may be formed by any known technique which would include, among other technological procedures, the etching of the through vias and channels. The through vias, as well as channels, preferably may be formed by a milling process through the dielectric substrate 50 at predetermined locations thereof by an energetic, preferably a laser beam with subsequent filling of the thus formed through vias 56 with a conducting material.

Figure 4:
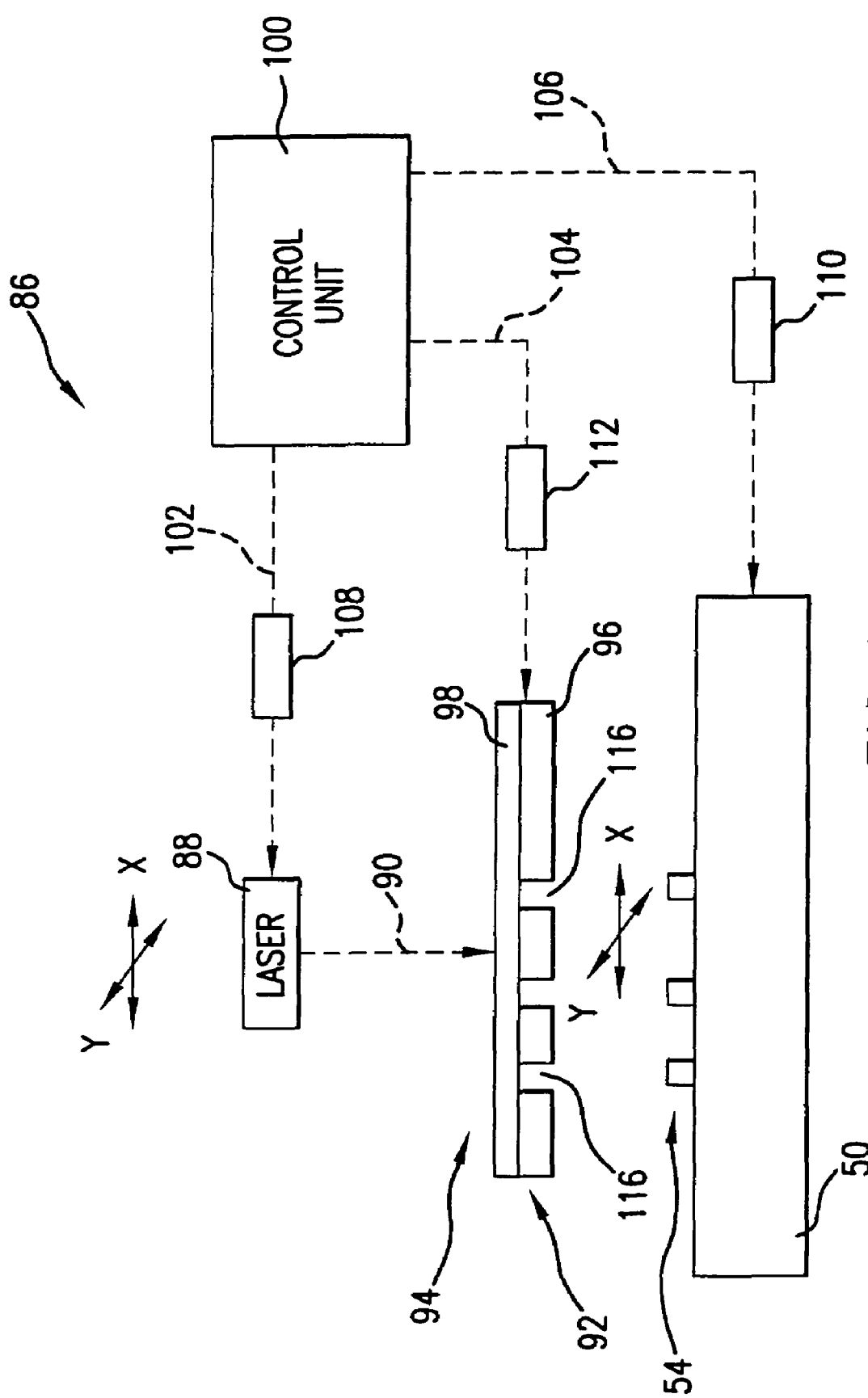
FIG. 4 shows schematically the arrangement for material transfer for pre-forming passive electrical elements on "backbone" layers (substrates)
Figure 5:
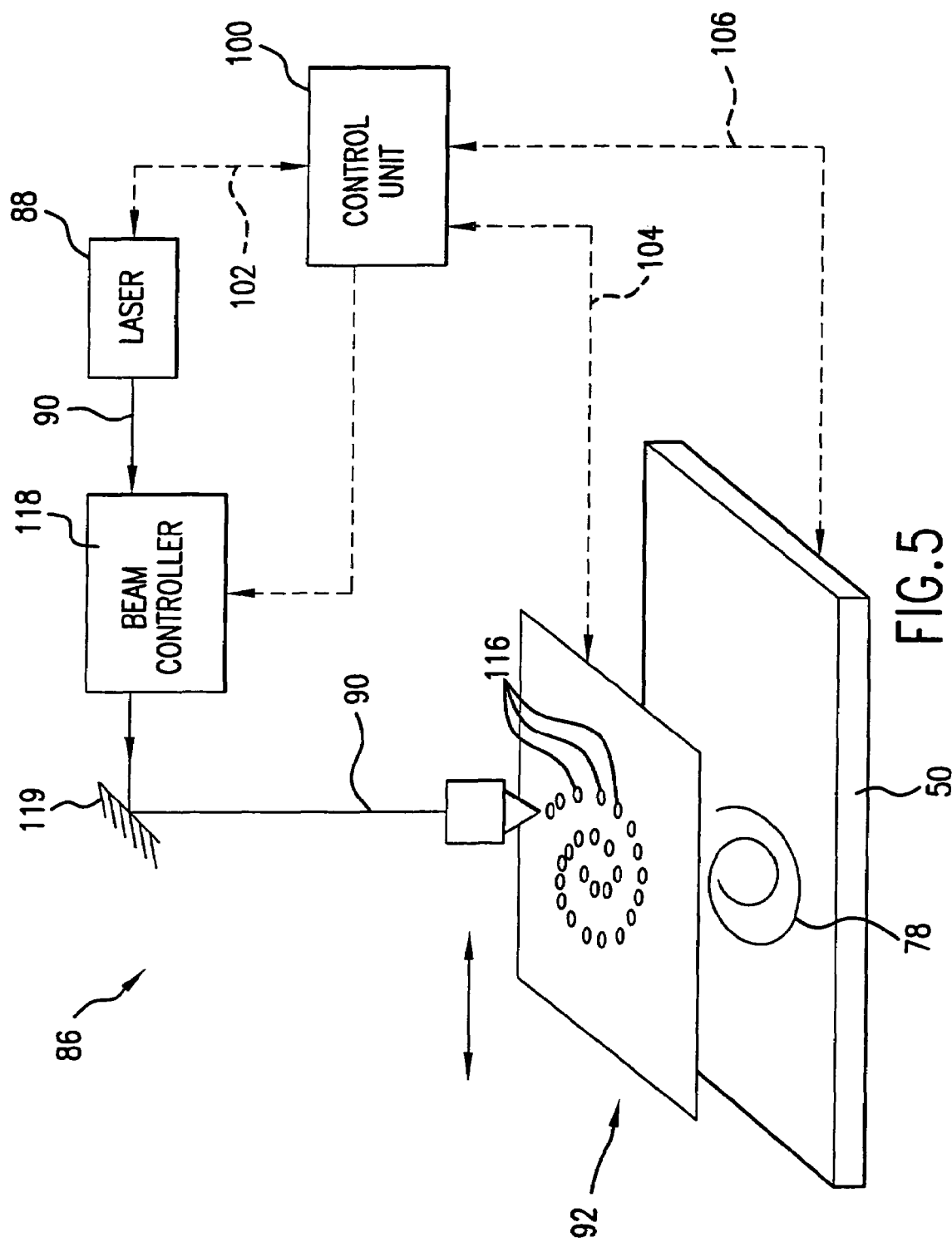
FIG. 5 shows schematically the process of pre-forming of a spiral inductor pattern on the substrate by means of the material transfer technique.

As an example and without limiting the scope of the present invention, it is contemplated in the present invention that for fabrication of miniature structures, such as capacitors, resistors, inductors, conducting lines and contact pads on the dielectric substrates, a material transfer method may be used which employs a material delivery system 86, shown in FIGS. 4 and 5. System 86 includes the substrate 50 on the surface of which miniature features are to be fabricated, a source of energy 88 (may be a laser) capable of generating an energetic beam 90, a material carrier element 92 displaceably positioned in a gap 94 formed between the source of energy 88 and the substrate 50, and a control unit 100 operatively coupled to the source of energy 88 through the transmission link 102 to the material carrier element 92 through the communication link 104, and to the substrate 50 through the communication link 106.

The energy source can be composed of either ions, electrons, or photons, and may be an ultraviolet laser, such as an excimer laser, as well as a waveguide excimer laser or a frequency multiplied solid state laser. For the sake of clarity, the laser will be further referred to as a source of energy. Thus, the backing element 98 is transparent to the UV radiation for allowing the laser beam 90 to impinge upon the deposition layer 96.

The material carrier element (or "ribbon") 92 comprises a transparent backing material 98 (transparent to the laser beam) upon which is coated a thin (1–10 µm) layer 96 of the material to be deposited. Compositions transparent to laser beams include fuse silica, borosilicate glass, polyester films such as Mylar, as well as a wide variety of other compositions. Two types of the material carrier elements may be used, including:
  (a) a disk, i.e., a circularly shaped "ribbon" spinning about its axis over the substrate 50 which is radially tracked when the laser 88 is firing; and
  (b) a flexible tape in a reel-to-reel mechanism which moves along its extended axis during deposition. The tape may also move laterally to expose new material to the impinging laser beam 90.

As shown in FIGS. 4 and 5, the control unit 100 is operatively coupled to the substrate 50 through the communication link 106. Depending on the mode of operation of the material delivery system 86 (to be discussed in detail in further paragraphs), either the material carrier element 92 or the substrate 50 will serve as a target exposed to the energy beam 90.

Through the communication link 102, the control unit 100 actuates/deactuates the source of energy 88 to generate or terminate the energy beam 90, regulates the parameters of the energy beam 90 such as fluence, size and shape of the cross-section of the beam, etc., as well as changes relative position between the energy beam 90 and the material carrier element 92 and/or the substrate 50 in a patterned fashion.

In this manner, the control unit 100 "scans" the energy beam 90 over the surface of the target (the substrate 50 and/or material carrier element 92) either by moving the source of energy 88 in X-Y directions or by changing the angular relative position of the energy beam 90 with regard to the target in a patterned fashion.

In order to change the relative disposition or location between the energy beam 90 and the target in a patterned fashion, the control unit 100 alternatively can control the target through the communication link 106 (for the substrate 50) or through the communication link 104 (for the material carrier element 92) by either keeping the energy beam immovable or moving the energy beam 90 in a coordinated fashion with the target.

In order to provide the control unit 100 with the function to manipulate the energy beam 90, the communication link 102 includes an electromechanical mechanism 108, shown in FIG. 4, known to those skilled in the art, which is a unit for translating the electrical signal output from the control unit 100 into a mechanical displacement of the source of energy 88 or into respective changes of an optic system of the source of energy 88.

In the same manner, the communication link 106 includes an electromechanical mechanism 110 which translates the electrical signal from the control unit 100 into the mechanical displacement of the substrate 50 in a patterned fashion.

Through the communication link 104, the control unit 100 is capable of manipulating the material carrier element 92 within the gap 94 along the X-Y direction so that the material carrier element 92 may be displaced either away from interception with energy beam 90 or to a position intercepting the energy beam 90. Similar to the mechanism 108 and 110, a mechanical displacement unit 112 is included into the communication link 104 to translate the signal generated by the control unit 100 into the mechanical displacement of the material carrier element 92.

The material delivery system 86 may operate in two modes:
  (1) "Additive" or "material transfer" mode of operation; and
  (2) "Subtractive" or "material removal" mode of operation.

The "ribbon" transport mechanism is designed to:
  during the "additive" mode of operation, which is used for material transfer from the deposition layer 96 and deposition of the material in a specific fashion on the surface of the substrate 50,
    (a) ensure that each laser pulse "sees" a new area of an untransferred material; and
    (b) move the "ribbon" to a new "track" of different material that might reside on the same "ribbon", and
  during the "subtractive" mode of operation, which is used to "mill" through vias 56 in the substrate 50,
    (c) move to a laser transparent area of the "ribbon", or
    (d) move out of the beam entirely to allow UV laser micromachining.

Thus, through the communication links 102, 104, and 106, the control unit 100 monitors positions of the source of energy 88 (specifically, the point of impingement of the beam 90 onto the surface of the target), material carrier element 92, and the substrate 50, respectively, in order to coordinate the relative interposition between the aforesaid units of the material delivery system 86 with activation-deactivation of the source of energy for pulsing-position synchronization that is essential for the high quality of manufactured miniature structures, such as resistors, capacitances, inductances, as well as conductor lines and contact pads.

As described in previous paragraphs, the control unit 100 may operate the system 86 in two modes of operation: "material removal" (or "subtractive") mode of operation and "material transfer" (or "additive") mode of operation. In the "material removal" mode of operation, the material carrier element 92 is displaced away from interception with the energy beam 90, while in the "material transfer" mode of operation, the material carrier element 92 intercepts the energy beam 90 path. Thus, the material delivery system 86 by performing both as a "Direct Write" and a "Micromachining" (DW/MM) machine, possesses the ability to accomplish pattern tasks such as laser surface cleaning, vias milling, as well as direct deposit of metal, ceramics, polymers, etc., in situ, in an air atmosphere and at generally room temperature.

In the "subtractive" mode of operation, patterned ablating, evaporation, melting, cutting, and cleaning processes of the present invention may be carried out. In the "additive" mode of operation, miniature structures are formed by depositing a depositable material from the deposition layer 96 of the material carrier element 92 onto the surface of the substrate 50.

The control unit 100 may change the mode of operation of the material delivery system 86 in any required sequence. Particularly, the control unit 100 may intermittently change the modes of operation of the system 86 between the "material transfer" mode of operation for depositing structures and the "material removal" mode of operation for excavating layers of the structure in any pre-programmed order.

For example, the control unit 100, initially sets the system 86 in the "additive" mode of operation by moving the material carrier element 92 into a position intercepting the energy beam 90 in a manner to perform a deposition step. This is accomplished by changing the relative disposition between the energy beam 90 and the material carrier element 92 in accordance with a predetermined pattern, thereby ablating required areas of the deposition layer 96. This causes material transfer from the areas of the deposition layer 96 into the respective areas of the substrate 50 and deposit of the depositable material contained in the deposition layer 96 of the material carrier element 92 onto the surface of the substrate 50 at predetermined locations for creating miniature structures needed for forming the resulting modular electrical circuit.

Subsequent to the "additive" mode of operation being completed, the control unit 100 changes the mode of operation of the material delivery system 86 to the "subtractive" mode of operation by displacing the material carrier element 92 from interception with the energy beam 90. This controlled displacement allows direct access of the energy beam 90 to the surface of the substrate 50.

By changing relative positioning between the energy beam 90 and the substrate 50 in accordance with another predetermined pattern, either cleaning the surface of the substrate 50 in a patterned fashion, creation of vias 56, channels, etc., may be accomplished. Alternatively, the "subtractive" mode of operation may be performed prior to the "additive" mode of operation for cleaning the surface of the substrate 50 as well as for forming vias and channels prior to the material transfer process.

The manufacturing process of each layer 40, 42, and 44, as well as adhesive (or contact pad) layers 48, thus may continue in this manner and may include a plurality of "material removal" and "material transfer" modes of operations performed in a required sequence for fabrication of miniature structures, such as capacitances 60, metallization patterns, resistors, inductances, as well as vias and channels on the substrate 50, thus pre-manufacturing "building blocks" for further assembly into a modular electrical circuit.

As shown in FIGS. 4 and 5, in the "additive" mode, the energy beam 90 impinges upon the material carrier element 92 which is provided with a material composition transparent to the radiation and modifies the deposition layer 96 in order that the depositable material contained in the deposition layer 96 transfers from spots 116 onto the surface of the substrate 50. Deposition is accomplished generally at locations freshly exposed on the surface of the substrate 50 during a previous cleaning process. Thus, miniature structures (deposition films) forming electrical components (such as conductors, resistors, capacitances, inductances, and contact pads) are created at the predetermined locations on the surface of the substrate 50.

The material delivery system 86 enables a wide variety of materials to be precisely positioned near the substrate 50 for subsequent Direct Write processes with the ability to create complex circuits or structures in a conformal manner on different substrates.

An important element of the material delivery system 86 is the material carrier element 92 which includes the backing material 98 that is transparent to the radiation of the source of energy 88. The deposition layer 96 contains at least one, but may include a plurality of depositable materials which are to be transferred to the substrate 50 for deposition thereon. The "Direct Write" process (carried out in the "additive" mode of operation of the system 86) is applicable to a wide variety of materials since the material carrier element 92 is capable of simultaneous multi-component content, i.e., several materials, such as metals, insulators, etc., which can be held in different areas of the same material carrier element 92 and selected under control of the control unit 100 as the fabrication process demands.

According to the shape of the backing element 98, the material carrier element 92 may be either of a tape type, ribbon type, disk type, or a pad type. It is important that the material carrier element 92 be maintained at a fixed distance from the substrate 50. The distance between the material carrier element 92 and the substrate 50 is important for optimized spatial resolution and optimum utilization of deposited materials. Generally, at atmospheric pressure, this distance between substrate 50 and carrier element 92 should not exceed 25 microns. To maintain the fixed distance between the material carrier element and the substrate, the material carrier element 92 has either a fixed spacer support or a moving spacer support.

In the "additive" mode of operation, the control unit 50 changes the relative position between the laser beam 90 and the material carrier element 92 in a manner that each pulse falls on areas of the deposition layer 96 not previously ablated. Otherwise, the laser energy transmitted through a "hole" in the material carrier element 92 may damage previously deposited structures or underlying features on the substrate 50.

Additionally the relative movement between the material carrier element 92 and the laser beam 90 is carried out in a manner to expose only non-ablated areas of the deposition layer 96 adjacent to previously ablated areas thus providing efficient utilization of the depositable material of the deposition layer 96.

The spatial resolution of the "Direct Write" technique, is generally limited by the attainable laser spot size or shape and by the precision of the motion system or beam steering mechanism. By adjusting the laser spot size and/or shape, the size and shape of the features are varied. Using laser forward transfer, gold lines may be obtained with a width less than 8 microns. Written features may be subsequently trimmed with one micron precision. Additionally, 10 micron wide conducting lines may be written followed by a 50 micron contact pad without a tool change. The "Direct Write" processes carried out in the system can attain write speeds of meters per second while maintaining a position tolerance to one micron. A 100 KHz pulse laser with a laser spot of 50 micron diameter at the material carrier element requires that either the material carrier element 92 or the laser beam 90 to translate at a linear rate of 5 meters per second.

The material carrier element 92 may move materials with sufficient velocity to obtain deposition rates as large as, for example, 150 $mm^3$/minute. When using "contact ribbon" transfers, large increase in speed can be realized by scanning beam with galvo-controlled mirrors.

Proper spacing and maintaining the substrate 50 and material carrier element 92 in substantially parallel relationship is of importance. A substrate holding chuck (not shown) is used for holding the substrate 50 and for adjusting the position thereof.

The substrate holding chuck may include a hot plate (or heater block) which has a heater and a thermocouple operating in a closed loop manner to achieve a constant temperature adjustable from ambient to approximately 500° C., preferably between 20° C. and 200° C. Heating the substrate improves the efficiency of the deposition and increases the quality of the transferred materials. Optionally, localized heating can be provided by a coaxial infrared laser beam (not shown).

The substrate holding chuck may include a pair of thermal driven high resolution X-Y stages (not shown) supporting the computer controlled Z-axis stage (not shown) which is required to both accommodate various substrate thicknesses, and to adjust for any significant built-up height (thickness) of the deposited features on the substrate 50.

A dual axis tilt stage (not shown) which is a stiff mirror mount is mounted on the Z axis stage for removing unwanted displacement of the substrate. Thus, by using X-Y stages, Z axis stages, and dual axis tilt stage, controlled by the control unit 100, independently each from the other, the surface of the substrate 50 is maintained in parallel relationship to the material carrier element 92 and spaced therefrom by a predetermined distance. During the "additive" mode of operation, the laser 88 may be scanned over the material carrier element 92 in a predetermined manner, or the substrate 50 moves in the X-Y plane under the control of the control unit 100 in a prescribed manner to write out the desired features on the substrate.

During the relative changes of interposition between the substrate 50, laser 88, and/or the material carrier element 92, laser actuation-deactuation is synchronized with the motion of the aforesaid units of the system 86, which may result in a spiral pattern of laser "footprints" on the material carrier element's deposition layer 96 (as best shown in FIG. 5) which is used for forming spiral inductances on the surface of the substrate 50.

Material carrier elements 92 can be easily changed when they are spent or when a material change is required.

As previously discussed, the source of energy 88, may be an ultraviolet pulsed laser. Specifically, all solid state frequency tripled neodymium vanadate lasers (radiating at approximately 355 nm), and frequency quadrupled energy laser (radiating approximately at 266 nm) are preferred since they offer high repetition rates, short pulses, sufficient beam quality, high average power, and superior reliability at low maintenance requirements.

The laser beam 90 generated by the laser 88 is controlled by the beam controller 118, as shown in FIG. 5, under the overall control and monitoring of the control unit 100. As disclosed in previous paragraphs, the beam control is embedded in the system 86 in order to deliver the laser beam of the desired optimal laser spot size, shape, and fluence to the material carrier element 92 or to the surface of the substrate 50.

Beam shape and size determines the resolution and pattern of the deposition or ablation. Once the shape, size and fluence of the laser beam 13 has been attained, the laser beam impinges upon the splitter 119 where the laser beam splits into a beam directed to the focusing objective which directs the focused beam to either the surface of the material carrier element 92 or to the surface of the substrate 50. The splitter 119 is highly reflective at the laser wavelength however substantially transparent in the invisible spectrum.

Another portion of the laser beam is directed by the splitter 119 to a video system (not shown) which may include a video microscope/video camera and a video monitor, the signal from which is supplied to a machine vision system for image capture and processing. Such an arrangement, specifically video system/machine vision system permits an operator to accurately position the substrate 50 for registration and scaling with existing pattern, to measure and inspect the substrate 50, and to facilitate leveling, focusing, and displacement of the substrate.

Figure 6:
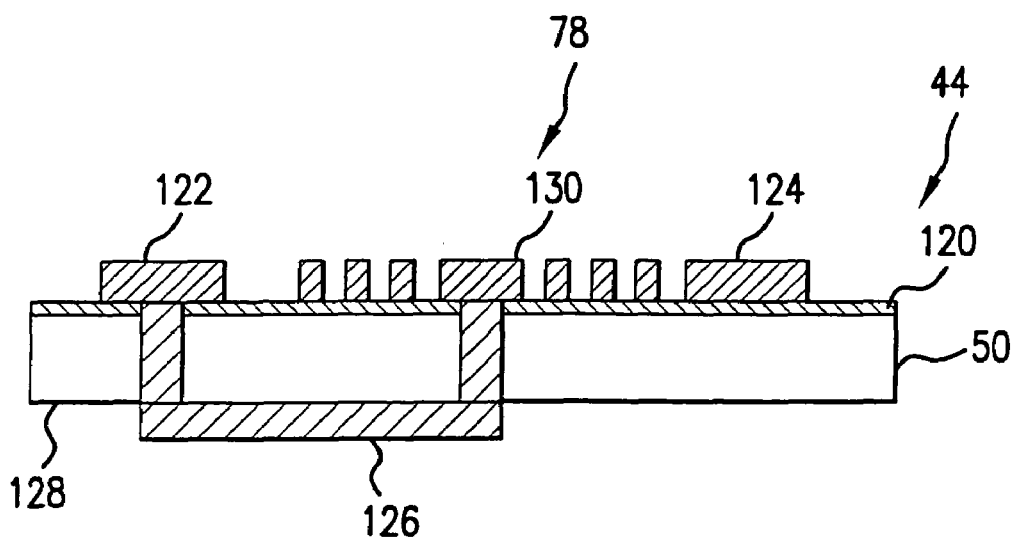
FIGS. 6 and 7 show, respectively, a cross-section of a "backbone" layer (substrate) with the inductor pattern formed thereon, along with conductors and through vias pre-filled with conductive material, and a topography of the spiral inductors on the surface of the dielectric layer of polyimide.
Figure 7:
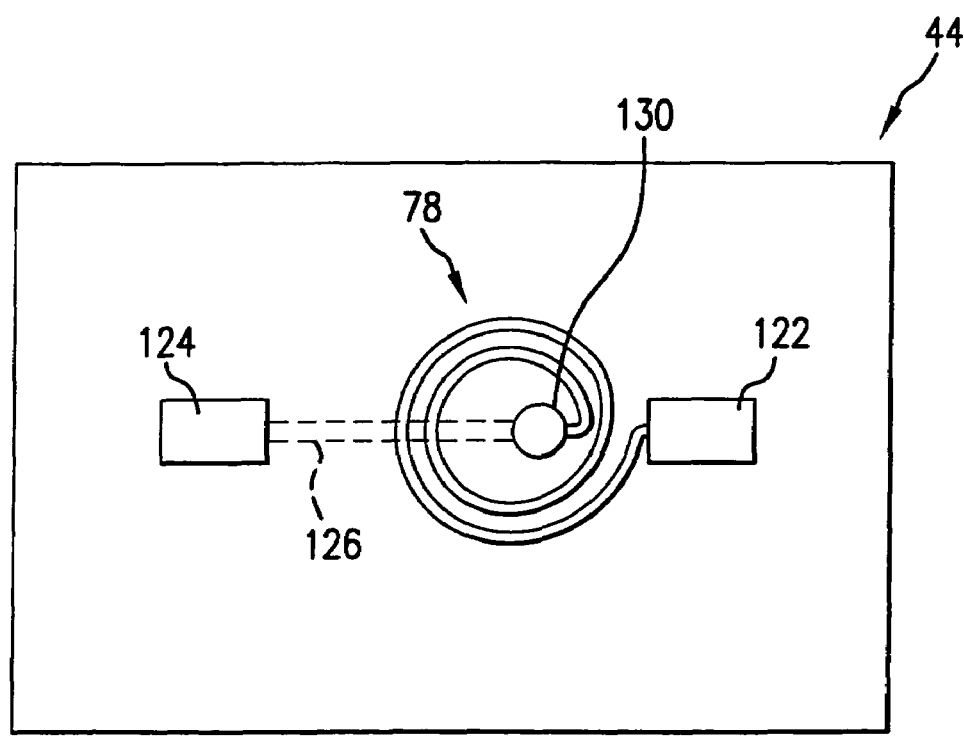

Referring now to FIGS. 6 and 7, showing respectively a cross-section and the topography of the inductor layer 44 of the present invention, such a layer includes the dielectric substrate 50, formed of polyimide, on which a polyimide layer 120 is sputtered, and where a spiral inductor 78 is formed along with contact pads 122 and 124. Through vias 56 are formed in the substrate 50 and filled with conducting material, such as silver. A conducting line 126 is formed on the lower surface 128 of the substrate 50 to electrically couple the inductor 78 through the vias 56 to the contact pad 122. Conducting lines 132, shown in FIG. 7, may be deposited on the bottom surface of the polyimide layer 120 to provide further connection of the inductor 78 to a resistor, or capacitance formed on dielectric substrates of neighboring layers, such as, for example, a resistor layer 42, or a capacitor layer 40 when assembled into a multi-layer modular structure.

A wide variety of electrical circuits may be manufactured by the method of the present invention. However for disclosure simplicity and clarity, an electrical circuit will be further described as a filter, which may be a high pass filter, low pass filter, or a bandpass filter, and which includes, as elements of the circuitry, such passive elements as resistors, capacitors, inductors, and various conductive line and contact pads, as well as through vias filled with conducting material all together serving for electrical coupling between the passive elements in a predetermined fashion to form a resulting modular electrical circuit.

Figure 8:
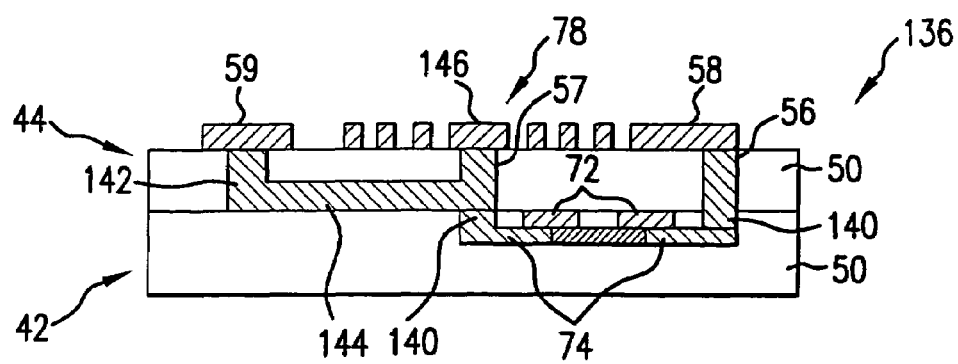
FIG. 8 is a cross-section of a two-layer modular structure containing a high pass filter (RL circuit)
Figure 9:
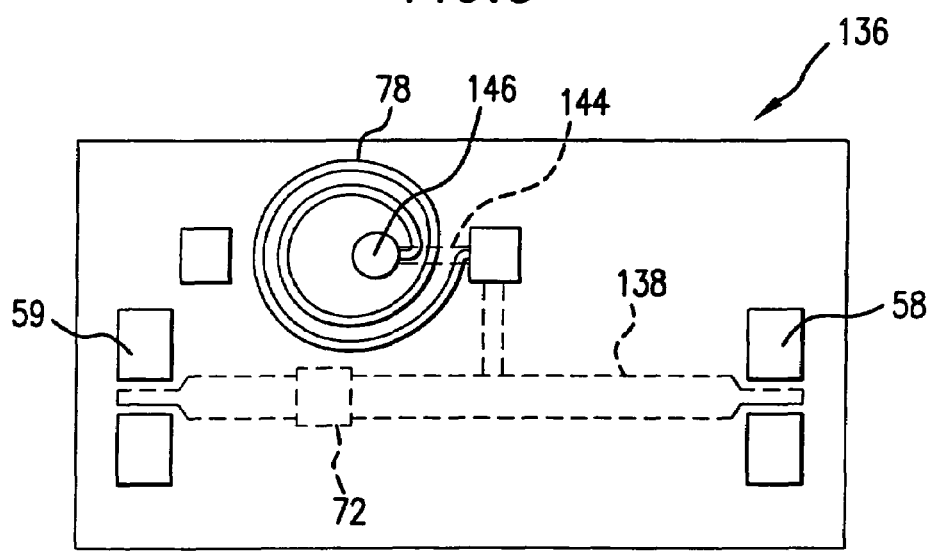
FIG. 9 shows a topography of the modular high pass filter of FIG. 8 on the upper layer thereof.

Thus, with regard to FIGS. 8 and 9, a high pass filter 136 is depicted which is manufactured as a modular structure in accordance with the principles of the present invention. Specifically, FIG. 8, illustrates the modular high pass filter 136 in cross-section thereof, and FIG. 9 illustrates the topology of the top layer of the modular structure containing the high pass filter 136 wherein the conducting lines 138 are shown in phantom lines. The high pass filter 136 includes the resistor layer 42 and the inductor layer 44 attached to the top of the resistor layer 42. As seen in FIG. 8, the resistor layer 42 includes a dielectric substrate 50, formed preferably from a Kapton material composition, in which a resistor 72 is pre-formed at a predetermined location of the dielectric substrate 50 with channels 140 milled and filled with the conducting material. Conductive lines 74 extend between the resistor 72 and the channels 140.

For the modular high pass filter 136, shown in FIG. 8, the inductor layer 44 is fabricated to include a dielectric substrate 50, possibly formed of a Kapton material composition, with the inductance 78 patterned on the surface of the dielectric substrate 50 through a transfer method. Through vias 56 and 57 formed on the dielectric substrates 50 in precise alignment with the channels 140 of the resistor layer 42 and pre-filled with the conductive material such as silver are provided. Two ports, formed with the contact pads 58 and 59, a through via 142 formed in alignment with the contact pads 59, and a conducting line 144 connecting the through via 57 with the through via 142 are also features of the inductor layer 44.

As shown in FIG. 8, although the resistor layer 42 and inductor layer 44 are pre-manufactured independently one from the other in previous technological processes, the positioning of the elements of each layer 42 and 44 is designed to be in accordance with the other. Specifically, the channels 140 of the resistor layer 42 are aligned with the through vias 56 and 57 of the inductor layer 44. The position of the through vias 56, 57, and 142 of the inductor layer 44 are formed to be in contact with the contact pad 58, a central terminal 146 of the inductance 78, and with the contact pad 59, respectively.

Thus a plurality of layers serve as fundamental blocks of the resulting modular electrical circuit although they are pre-manufactured independently one from another. The layers are designed to be mutually compatible each with the other which means that the position of each element on each "backbone" layer is thoroughly predetermined to be in alignment or in accord with elements on neighboring layers. The design of each pre-manufactured layer makes optimal use of "real estate" or area of each "backbone" layer and avoids possible short circuits between the elements. This allows the fabrication of the modular electrical circuits to be designed within strict size limitations.

Figure 10:
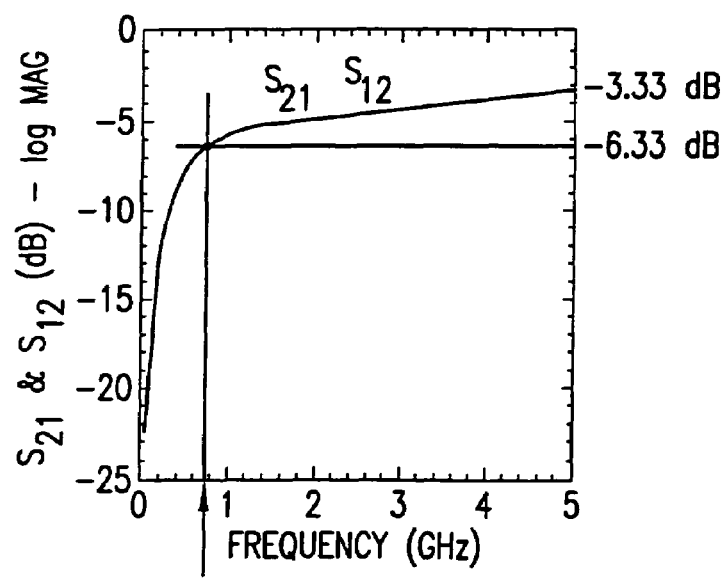
FIG. 10 is a loss vs. frequency diagram of the high pass filter shown in FIGS. 8 and 9.

A loss vs. frequency diagram, of FIG. 10, shows the cut off frequency of 770 MHz with the loss of −6.33 dB at the point of cut-off, attained by the high pass filter 136 manufactured by the method of the present invention wherein the values of the inductance 78 and the resistor 72 are, for example, as follows:

$L=1.65$ nH, $R=10$ Ω.

Figure 11:
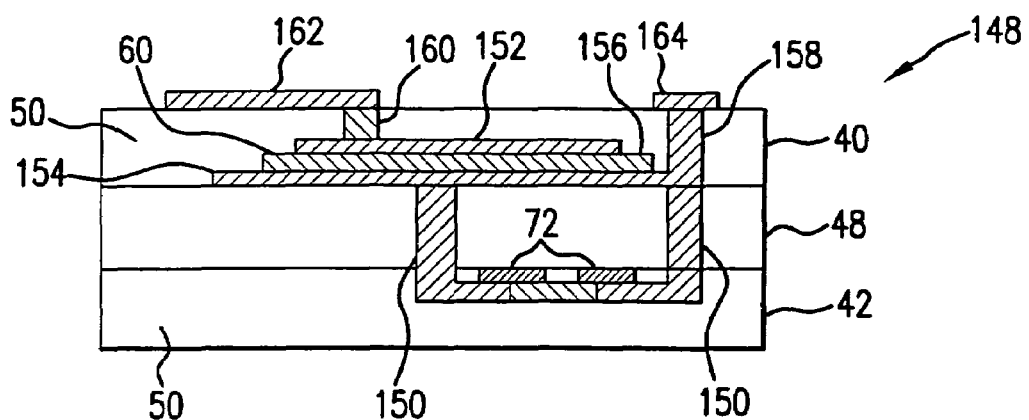
FIG. 11 is a cross-section of a three-layer modular low pass filter (RC circuit)
Figure 12:
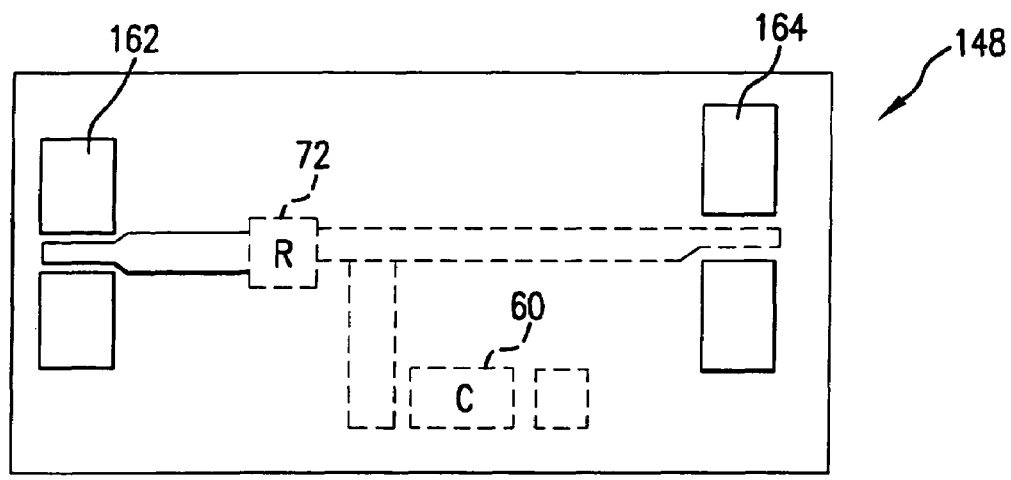
FIG. 12 shows a topography of the top surface of the low pass filter of FIG. 11.

Referring to FIGS. 11 and 12, showing a modular low pass filter 148 in the form of an RC circuit, such a structure comprises the resistor layer 42 similar to that one of the high pass filters shown in FIG. 8, a capacitor layer 40, and a contact pad layer 48 which is a dielectric layer, fabricated from a Kapton material with through vias 150 milled therein at predetermined locations thereof and filled with a conducting material.

As best shown in FIG. 11, the capacitor layer 40 includes the dielectric substrate 50, a capacitor 60 formed therein which includes two layers of conducting material 152 and 154 serving as electrodes of the capacitor 60, and a layer of dielectric 156 sandwiched therebetween. Further, the capacitor layer 40 includes a through via 158 filled with the conducting material and positioned in electrical engagement with the layer of conducting material 154, as well as a via 160 filled with a conducting material and positioned in electrical engagement with the layer 152 of conducting material. The contact pads 162 and 164 are deposited on the surface of the capacitor layer 40 in contact with the via 160 and the through via 158, respectively.

Again, as shown in FIG. 11, the positioning of the elements of each constituent layer of the modular low pass filter 148 is pre-designed with the requirement of optimal modular design and compatibility of the layers 40 and 42.

Figure 13:
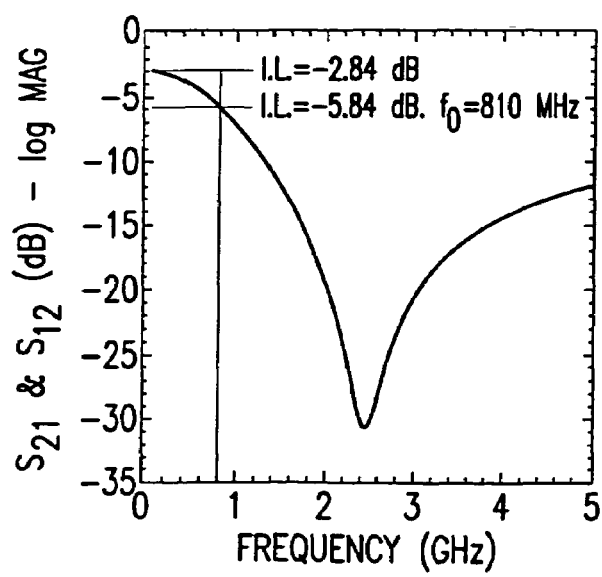
FIG. 13 is a loss vs. frequency diagram of the low pass filter of FIGS. 11 and 12.

The loss vs. frequency diagram, represented in FIG. 13, shows that the low pass filter 148 has a cut-off frequency in the range of 810 MHz, with insertion losses −2.84 dB at maximum bandpass, and −5.84 dB at the cut-off frequency. To attain the parameters of the low pass filter as presented, the values of the passive electrical elements are, for example, as follows: R=10 Ω, C=150 pF.

Figure 14:
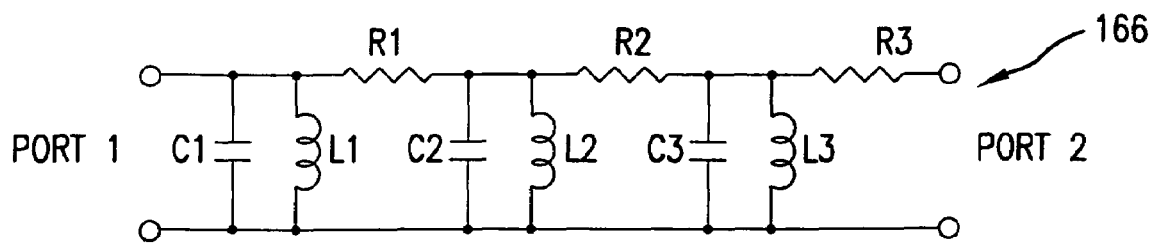
FIG. 14 is a schematic representation of an electrical circuitry of a bandpass filter.
Figure 15:
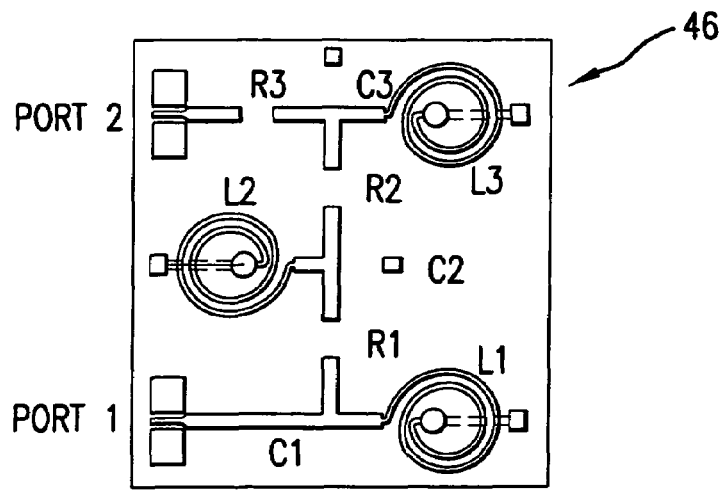
FIG. 15 shows a topography of the top layer of a three-layer modular bandpass filter.
Figure 16:
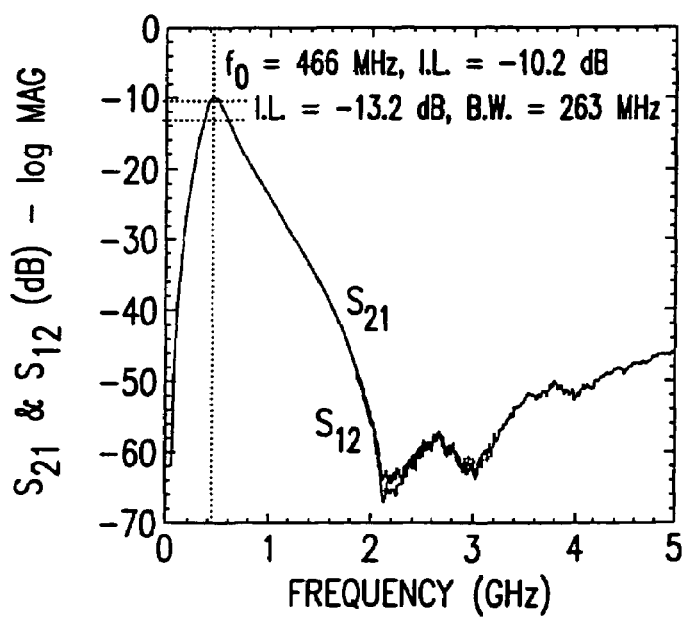
FIG. 16 is a loss vs. frequency diagram of the bandpass filter of FIGS. 3, 14, and 15.

Referring now to FIG. 14, representing an electrical diagram of a bandpass filter 166, known to those skilled in the art, and FIGS. 3 and 15, representing the modular implementation 46 of the bandpass filter 166 of FIG. 14, such a modular structure 46, as best shown in FIG. 3, includes the capacitor layer 40, resistor layer 42, and inductor layer 44 interposed with respective contact pad layers 48 attached each to the other in predetermined aligned fashion and secured each to the other by means of lamination with pressure and temperature.

In the modular bandpass filter 166, the capacitor layer 40 may include a dielectric substrate 50, made possibly from a Kapton material, a ground metallization 70 deposited on the bottom surface of the substrate 50, a plurality of through vias 56 filled with the conducting material such as silver, and the capacitor 60 formed on the top of the dielectric substrate 50. As disclosed in previous paragraphs, the capacitor 60 includes the layer of conducting material 62, dielectric layer 64, and electrodes 66 and 68 deposited in sequence on the top of the dielectric substrate 50 formed by any known technology in the miniature features manufacturing but preferably by "direct" deposition process disclosed in previous paragraphs.

The resistor layer 42 may include a dielectric substrate 50 with the through vias 56 formed therein and filled with a conducting material, and a plurality of resistors 72 coupled therebetween by conductive lines 74 in a predetermined order.

The inductor layer 44 may include a dielectric substrate 50 with the through via 56 formed therein and with the inductor patterns formed on the top surface of the dielectric substrate 50. On the bottom surface of the dielectric substrate 50, there is a contact pad 82 formed in alignment with the through via 56.

The contact pads layers 48 interposing the layers 40 and 42, and the layers 42 and 44, as well as the contact pad layer 168, positioned on the top of the inductor layer 44, are dielectric substrates with the contact pads formed therein in precise alignment with the respective elements of each constituent layer of the resulting modular structure 46 containing the bandpass filter 166, which is illustrated in FIG. 14.

The loss vs. frequency diagram for the bandpass filter 166 manufactured in modular implementation in accordance with the principles of the present invention, show that such a filter attains center frequency $f_0$=466 MHz, bandwidth=263 MHz, and insertion losses at center frequency=−10.2 dB.

The modular electrical circuits manufactured with the method of the present invention, are trimmable and bendable modules with embedded passives. The manufacturing technique of the present invention easily permits rework of the resulting modular structures, uses low processing temperatures, avoids exposure of the electrical elements to multiple "firing" cycles, and enjoys short turnaround time.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended Claims.

What is claimed is:

1. A passive component assembly for a modular electrical circuit, comprising:

a plurality of substrates each made of an insulating material, at least one through via formed through each said substrate and filled with a conductive material, a first passive component type being exclusively formed on a first portion of said plurality of substrates of insulating material and at least one component of said first passive component type being in contact with said at least one conductively filled through via of said first portion of said substrates;

a second passive component type being exclusively formed on a second portion of said plurality of substrates of insulating material, said second passive component type being different than said first passive component type, at least one component of said second passive component type being in contact with said at least one conductively filled through via of said second portion of said substrates, said first and second portions of said substrates being overlaid in a selected sequence; and a contact pad layer disposed between overlaying substrates for bonding one to another, each said contact pad layer having at least one conductively filled through via for interconnecting at least one component of an underlying substrate with at least one component of an overlying substrate to form an electrical circuit.

2. The passive component assembly of claim 1, further comprising a third passive component type being exclusively formed on a third portion of said plurality of substrates of insulating material, said third passive component type being different than said first and second passive component types, at least one component of said third passive component type being in contact with said at least one conductively filled through via of said third portion of said substrates, said third portion of said substrates being included in said selected sequence of overlaid substrates, said first, second and third passive component types being selected from resistors, capacitors and inductors.

3. A modular electrical circuit structure having at least a first and a second passive component, said modular electrical circuit structure comprising:

at least first and second pre-manufactured components laminated each to the other in a predetermined fashion, each said pre-manufactured component comprising a substrate and at least one of said first and second passive components formed thereon prior to said lamination, at least one of said pre-manufactured components having a substrate with at least one structure selected from a passive component, a conductor line or a combination thereof being formed on each of two opposing sides of said substrate, said at least one structure on each of said two opposing sides of said substrate being electrically interconnected by at least one conductively filled via formed through said substrate.

4. The modular electrical circuitry of claim 3, further comprising at least one adhesive layer having a dielectric layer and at least one through via formed in said dielectric layer and filled with a conducting material, said at least one adhesive layer being interposed between said first and second pre-manufactured components.

5. The modular electrical circuit structure of claim 3, wherein said at least one structure on at least one of said two opposing sides of said substrate being formed in a channel formed into a surface of said substrate.

6. A modular electrical circuit structure comprising:

a first pre-manufactured component having at least one first passive component limited exclusively to a resistor component type formed thereon and at least one conductively filled via formed therethrough and electrically coupled to said at least one first passive component, a second pre-manufactured component having at least one second passive component limited exclusively to an inductor component type formed thereon and at least one conductively filled via formed therethrough and electrically coupled to said at least one second passive component, and a third pre-manufactured component having at least one third passive component limited exclusively to a capacitor component type formed thereon and at least one conductively filled via formed therethrough and electrically coupled to said at least one third passive component, said at least one resistor, inductor and capacitor component types being interconnected through said at least one via formed in each of said first, second and third pre-manufactured components, to form a bandpass filter.

* * * * *